(12) United States Patent
Kitagawa

(10) Patent No.: US 9,608,199 B1
(45) Date of Patent: Mar. 28, 2017

(54) MAGNETIC MEMORY DEVICE

(71) Applicant: KABUSHIKI KAISHA TOSHIBA, Minato-ku, Tokyo (JP)

(72) Inventor: Eiji Kitagawa, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/069,691

(22) Filed: Mar. 14, 2016

Related U.S. Application Data

(60) Provisional application No. 62/216,204, filed on Sep. 9, 2015.

(51) Int. Cl.
| | |
|---|---|
| *H01L 43/08* | (2006.01) |
| *H01L 29/82* | (2006.01) |
| *H01L 43/10* | (2006.01) |
| *H01L 21/20* | (2006.01) |
| *H01L 43/02* | (2006.01) |
| *G11C 11/16* | (2006.01) |
| *H01L 27/22* | (2006.01) |

(52) U.S. Cl.
CPC ............ *H01L 43/10* (2013.01); *G11C 11/161* (2013.01); *H01L 27/222* (2013.01); *H01L 43/02* (2013.01); *H01L 43/08* (2013.01)

(58) Field of Classification Search
CPC ....... H01L 27/222; H01L 43/02; H01L 43/08; H01L 43/10; G11C 11/161
USPC ................ 257/295, 421, 422, 425, E43.001, 257/E43.004, E43.006, E27.006, 257/E29.323, E29.327, E21.09, E21.665; 438/3; 365/154, 171; 428/811.5
See application file for complete search history.

(56) References Cited

U.S. PATENT DOCUMENTS

| | | | |
|---|---|---|---|
| 9,355,699 B2* | 5/2016 | Khalili Amiri | ....... G11C 11/161 |
| 2010/0041168 A1* | 2/2010 | Nam | ...................... H01L 43/12 438/3 |
| 2010/0178528 A1 | 7/2010 | Tsunekawa et al. | |
| 2012/0068285 A1* | 3/2012 | Kitagawa | ............ H01F 10/3286 257/421 |
| 2013/0187248 A1 | 7/2013 | Kariyada et al. | |
| 2014/0264673 A1* | 9/2014 | Kitagawa | ................ H01L 43/10 257/421 |
| 2016/0043305 A1* | 2/2016 | Ochiai | .................... H01L 43/08 257/421 |

(Continued)

FOREIGN PATENT DOCUMENTS

| | | |
|---|---|---|
| JP | 2009283499 A | 12/2009 |
| JP | 2012174709 A | 9/2012 |
| JP | 2014007263 A | 1/2014 |

*Primary Examiner* — Dao H Nguyen
(74) *Attorney, Agent, or Firm* — Holtz, Holtz & Volek PC

(57) ABSTRACT

According to one embodiment, a magnetic memory device includes a stack structure including a first magnetic layer variable in magnetization direction, a second magnetic layer fixed in magnetization direction, and a nonmagnetic layer between the first magnetic layer and the second magnetic layer, the first magnetic layer including a first layer, a second layer, and a third layer between the first layer and the second layer and containing magnesium (Mg), iron (Fe), and oxygen (O), the second layer being between the nonmagnetic layer and the third layer, wherein a thickness of the second layer is greater than that of the first layer, and the thickness of the first layer is greater than that of the third layer.

19 Claims, 9 Drawing Sheets

(56) References Cited

U.S. PATENT DOCUMENTS

2016/0268501 A1* 9/2016 Kitagawa ............... H01L 43/08

* cited by examiner

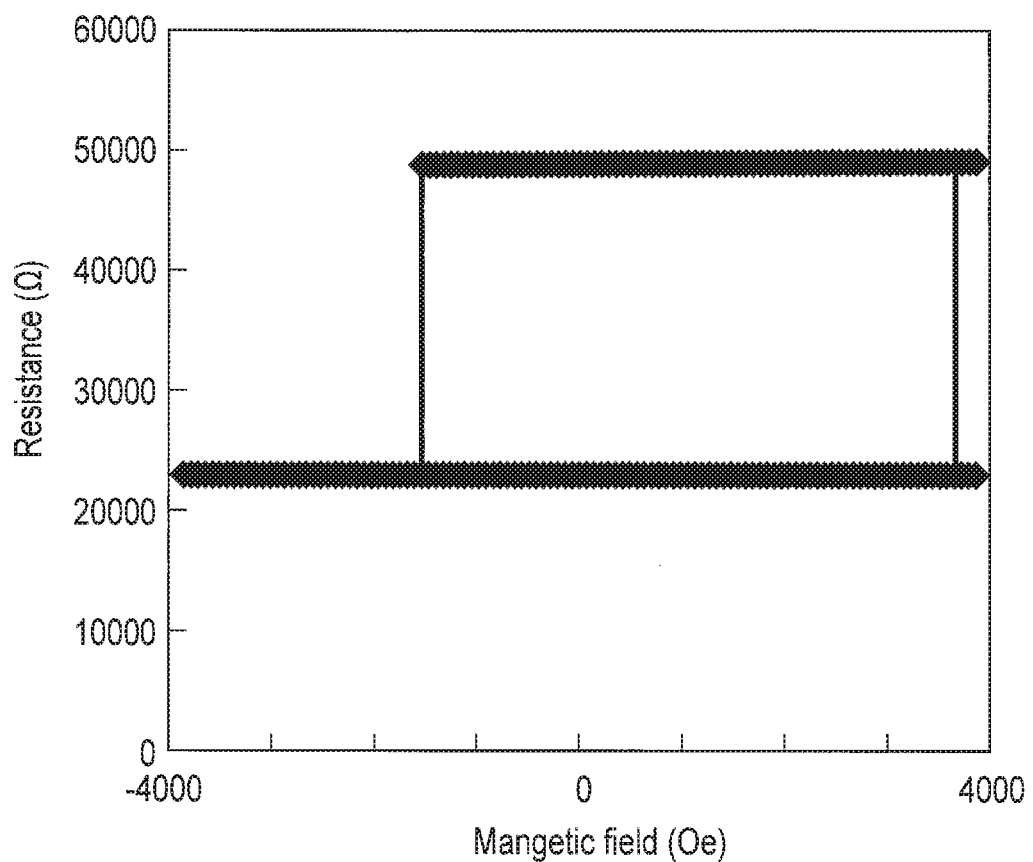
F I G. 6

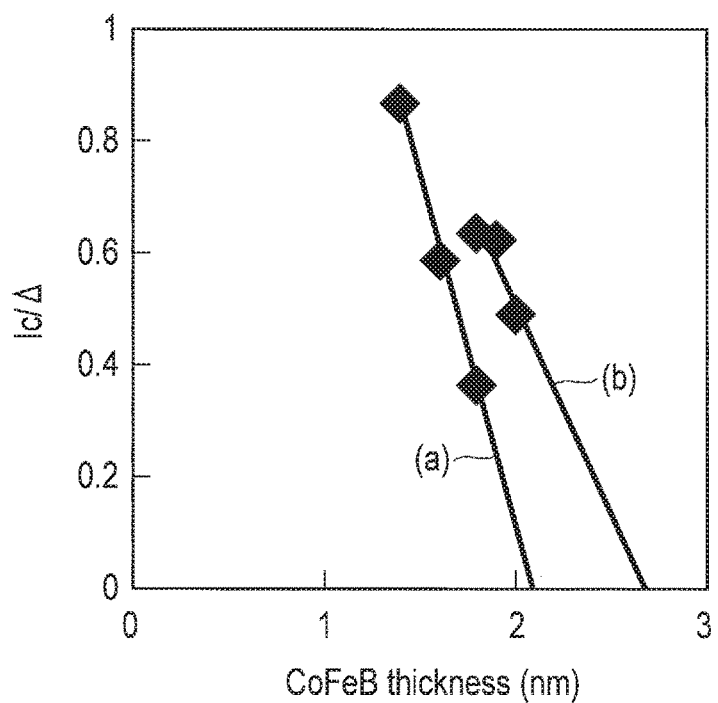
F I G. 7
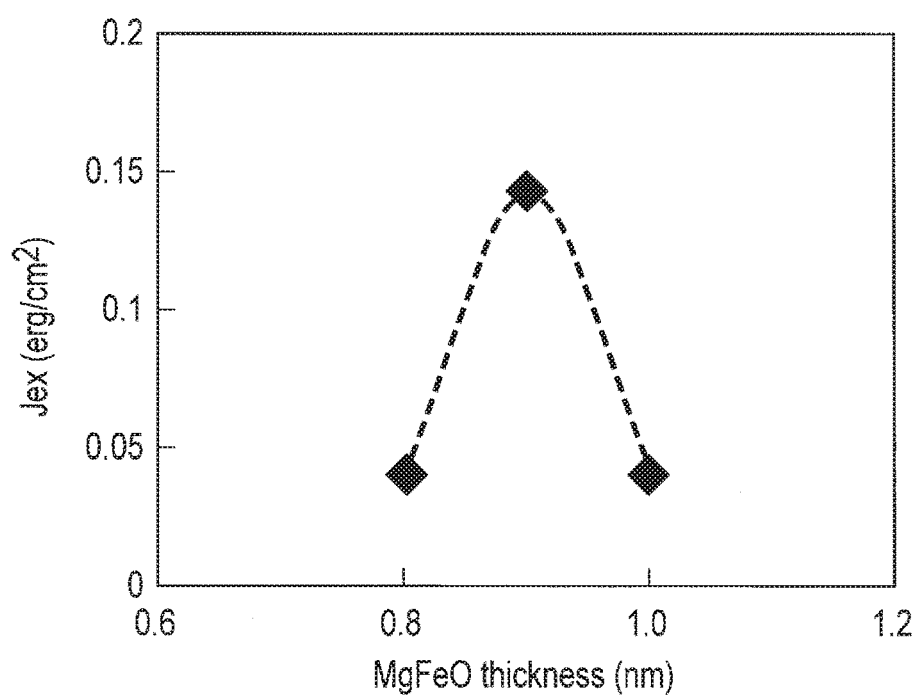
F I G. 8

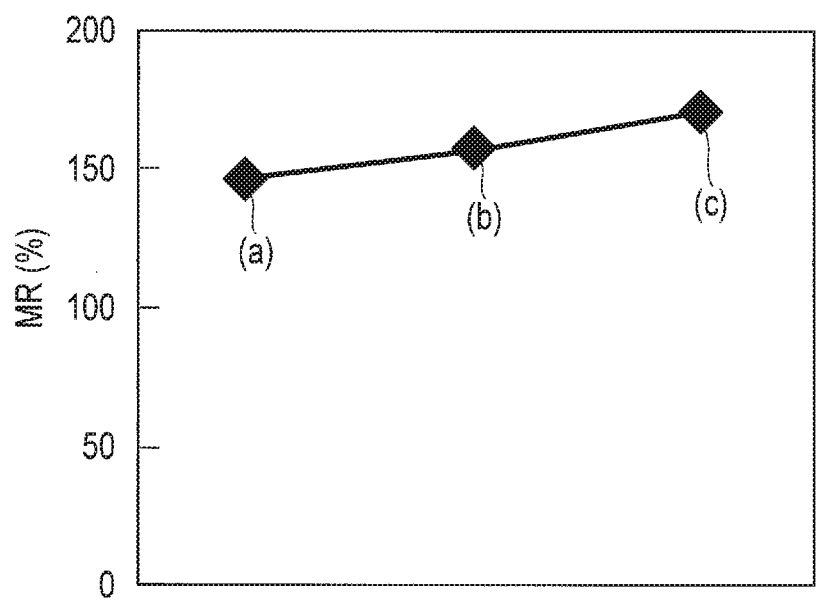
F I G. 11
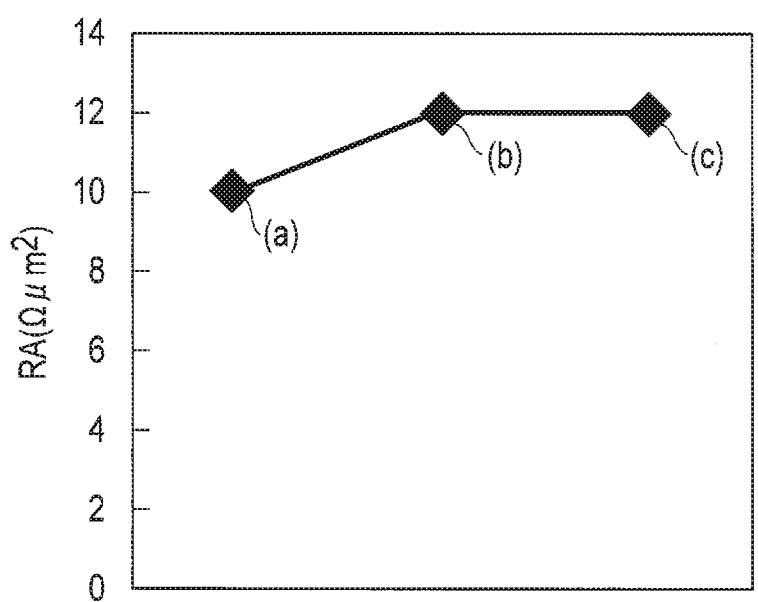
F I G. 12

MAGNETIC MEMORY DEVICE

CROSS-REFERENCE TO RELATED APPLICATIONS

This application claims the benefit of U.S. Provisional Application No. 62/216,204, filed Sep. 9, 2015, the entire contents of which are incorporated herein by reference.

FIELD

Embodiments described herein relate generally to a magnetic memory device.

BACKGROUND

A magnetic memory device (a semiconductor integrated circuit device) in which transistors and magnetoresistive effect elements are integrated on a semiconductor substrate is proposed.

The magnetoresistive effect element must be high in thermal disturbance resistance Δ and low in write current Ic. However, the magnetoresistive effect element which completely satisfies such a requirement does not necessarily exist until now.

BRIEF DESCRIPTION OF THE DRAWINGS

FIG. 6 is a view illustrating the relation between a magnetic field and resistance obtained by measuring the magnetoresistive effect element in the first embodiment.

FIG. 7 is a view illustrating the relation between thickness and Ic/Δ obtained based on the measurement results of a CoFeB layer.

FIG. 8 is a view illustrating the magnitude of the ferromagnetic exchange coupling exhibited by an MgFeO layer.

FIG. 11 is a view illustrating a change in measurement result of the MR ratio as the stack structure is changed in configuration.

FIG. 12 is a view illustrating a change in measurement result of resistance-area product RA as the stack structure is changed in configuration.

DETAILED DESCRIPTION

In general, according to one embodiment, a magnetic memory device includes: a stack structure including a first magnetic layer variable in magnetization direction, a second magnetic layer fixed in magnetization direction, and a nonmagnetic layer between the first magnetic layer and the second magnetic layer, the first magnetic layer including a first layer, a second layer, and a third layer between the first layer and the second layer and containing magnesium (Mg), iron (Fe), and oxygen (O), the second layer being between the nonmagnetic layer and the third layer, wherein a thickness of the second layer is greater than that of the first layer, and the thickness of the first layer is greater than that of the third layer.

Now, embodiments will be explained with reference to the drawings.

Embodiment 1

Figure 1:
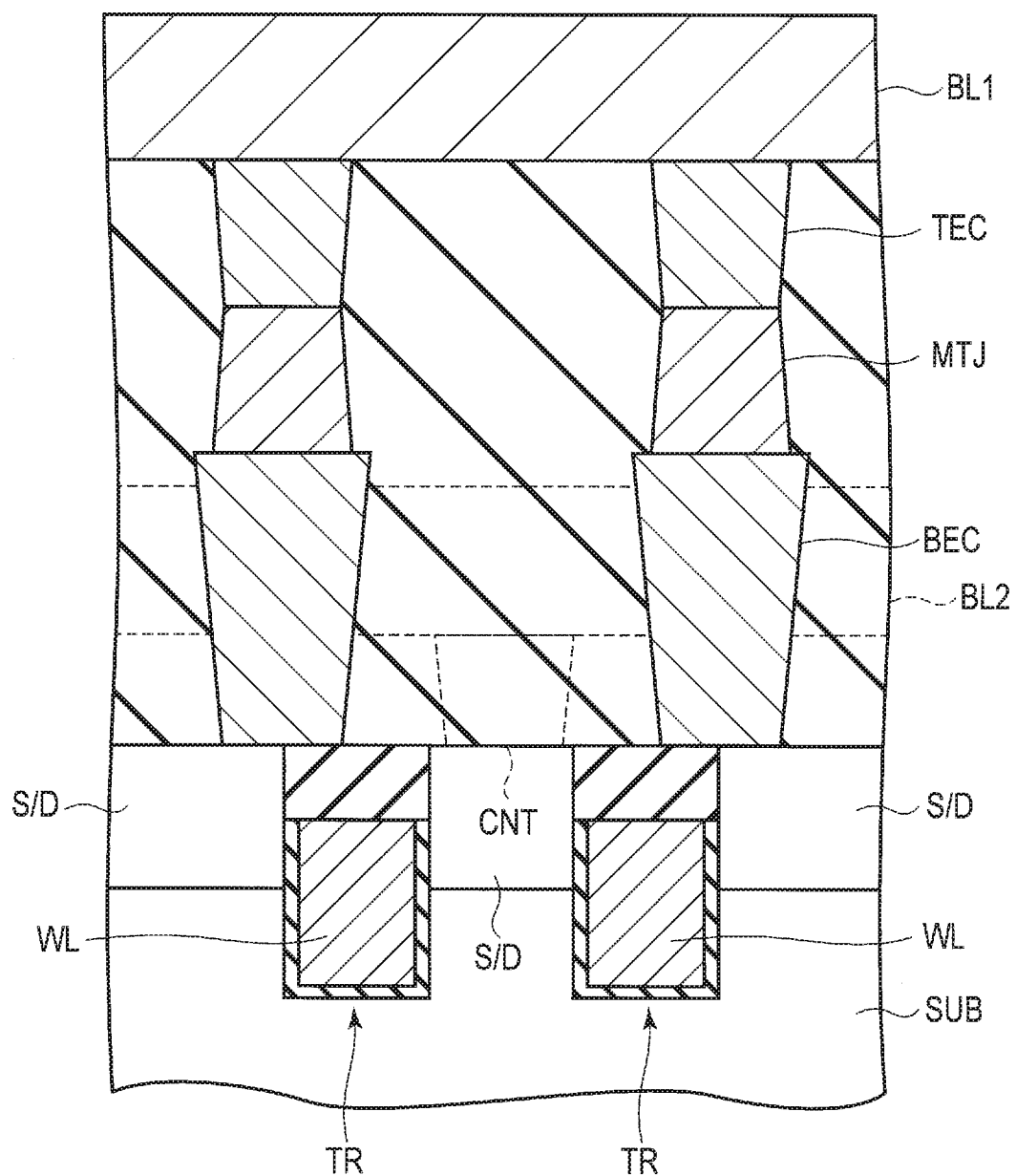
FIG. 1 is a sectional view schematically illustrating the configuration of a magnetic memory device which uses magnetoresistive effect elements in a first embodiment.

FIG. 1 is a sectional view schematically illustrating the configuration of a magnetic memory device (a semiconductor integrated circuit device) which uses magnetoresistive effect elements (magnetic tunnel junctions [MTJs]) in a first embodiment.

As illustrated in FIG. 1, a buried-gate MOS transistor TR is formed in a semiconductor substrate SUB. The MOS transistor TR has a gate electrode which is used as a word line WL. The MOS transistor TR has a source/drain area S/D, one of which is connected to a bottom electrode BEC, and the other of which is connected to a contact CNT.

The bottom electrode BEC is provided with a magnetoresistive effect element MTJ. The magnetoresistive effect element MTJ is provided with a top electrode TEC. The top electrode TEC is connected to a first bit line BL1. The contact CNT is connected to a second bit line BL2.

Figure 2:
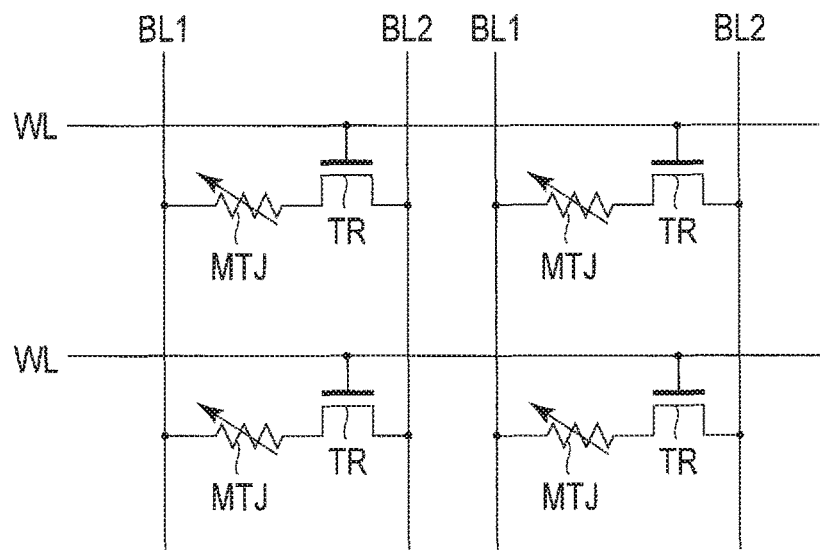
FIG. 2 is an equivalent circuit schematically illustrating the configuration of the magnetic memory device which uses the magnetoresistive effect elements in the first embodiment.

FIG. 2 is an equivalent circuit schematically illustrating the configuration of the magnetic memory device (semiconductor integrated circuit device) which uses the magnetoresistive effect elements in the present embodiment.

As illustrated in FIG. 2, series circuit units, each comprising a magnetoresistive effect element MTJ and a MOS transistor TR, are arrayed. Each of the series circuit units has two ends, one of which is connected to the first bit line BL1, and the other of which is connected to the second bit line BL2. The magnetoresistive effect element MTJ has a gate electrode which is connected to the word line WL.

Figure 3:
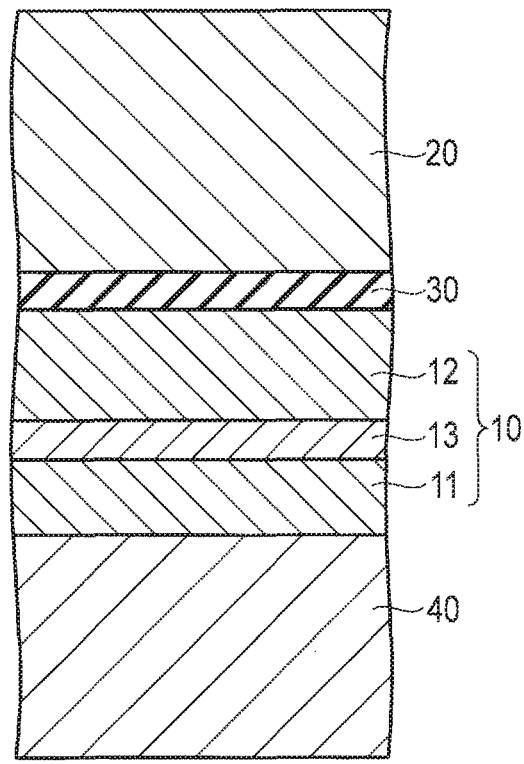
FIG. 3 is a sectional view schematically illustrating how the stack structure of the magnetoresistive effect element in the first embodiment is formed.

FIG. 3 is a sectional view schematically illustrating the configuration of the stack structure of the magnetoresistive effect element in the present embodiment.

The stack structure illustrated in FIG. 3 includes a storage layer (a first magnetic layer) 10 variable in magnetization direction, a reference layer (a second magnetic layer) 20 fixed in magnetization direction, and a tunnel barrier layer (a nonmagnetic layer) 30 between the storage layer 10 and the reference layer 20. In the example of FIG. 3, the stack structure further has an under layer 40.

The storage layer (first magnetic layer) 10 includes a first layer 11, a second layer 12, and a third layer 13 between the first layer 11 and the second layer 12. The second layer 12 is between the tunnel barrier layer (nonmagnetic layer) 30 and the third layer 13.

The first layer 11 and the second layer 12 individually contain iron (Fe) and boron (B). Furthermore, the first layer 11 and the second layer 12 individually contain cobalt (Co) in addition to iron (Fe) and boron (B) in the present embodiment. Specifically, the first layer 11 and the second layer 12 are individually a CoFeB layer. The third layer 13 contains magnesium (Mg), iron (Fe), and oxygen (O). Specifically, the third layer 13 is an MgFeO layer.

Since the MgFeO layer, which is a perpendicular magnetization film, is used as the third layer 13, at least Fe is commonly included in the first layer 11, the second layer 12, and the third layer 13. Therefore, wettability is improved, because of which flatness is improved, resulting in an increased MR ratio. Moreover, since the MgFeO layer is a magnetic layer, the storage layer 10 including the first layer 11, the second layer 12, and the third layer 13 is a magnetic layer. The above configuration makes it possible to increase the activation volume of the storage layer 10. As a result, a high $\Delta$ is achieved. Moreover, a low Ic is achieved by adjusting each of the layers in terms of thickness and composition, as will be described later. Therefore, it is possible to obtain a magnetoresistive effect element, which exhibits a high MR ratio, a high $\Delta$, and a low Ic, by forming the storage layer 10 to have such a structure as CoFeB/MgFeO/CoFeB, FeB/MgFeO/FeB, or CoFeB/MgFeO/FeB, for example.

In the present embodiment, a thickness of the second layer 12 is greater than that of the first layer 11, and the thickness of the first layer 11 is greater than that of the third layer 13. Specifically, it is preferable that the thickness of the second layer 12 is 1.8 nm or more, the thickness of the first layer 11 is between 1.2 and 1.6 nm, and the thickness of the third layer 13 is between 0.7 and 1.0 nm. Thicknesses of the layers will be explained in detail later.

The reference layer (second magnetic layer) 20 has a structure where a CoFeB layer, a Ta layer, a CoFeB layer, and a TbCoFe layer are placed one upon another in this order from the lower layer side to the upper layer side.

The tunnel barrier layer (nonmagnetic layer) 30 contains magnesium (Mg) and oxygen (O). Specifically, the tunnel barrier layer 30 is an MgO layer.

The under layer 40 is formed to have a stack structure comprising a ScHfB layer, which is at a lower layer side, and an AlScN layer, which is at an upper layer side.

The storage layer 10 and the reference layer 20 individually are a ferromagnetic layer which has perpendicular magnetization. That is, the storage layer 10 has a perpendicular magnetization direction perpendicular to its principal plane (perpendicular magnetic anisotropy), and the reference layer 20 has the perpendicular magnetization direction perpendicular to its principal plane (perpendicular magnetic anisotropy).

The resistance of the stack structure (resistance of the magnetoresistive effect element) exhibited when the storage layer 10 and the reference layer 20 are parallel to each other in magnetization direction is lower than resistance of the stack structure (resistance of the magnetoresistive effect element) exhibited when the storage layer 10 and the reference layer 20 are antiparallel to each other in magnetization direction. Namely, when the storage layer 10 and the reference layer 20 are parallel to each other in magnetization direction, the magnetoresistive effect element (MTJ element) attains a low-resistance state, whereas, when the storage layer 10 and the reference layer 20 are antiparallel to each other in magnetization direction, the magnetoresistive effect element (MTJ element) attains a high-resistance state. Consequently, the magnetoresistive effect element stores a binary value (0 or 1) according to which resistance state (low or high resistance state) the magnetoresistive effect element has attained. Moreover, the magnetoresistive effect element is brought into one of two resistance states (a low-resistance state and a high-resistance state) according to the direction of the write current which flows in the magnetoresistive effect element.

As has been described above, the storage layer 10 in the present embodiment has a structure in which the third layer 13 containing magnesium (Mg), iron (Fe), and oxygen (O) is between the first layer 11 and the second layer 12. Furthermore, the second layer 12 is thicker than the first layer 11, and the first layer 11 is thicker than the third layer 13. Such a configuration makes it possible to make the first layer 11 smaller than the second layer 12 in magnetization amount per unit area (Mst), resulting in obtainment of a magnetoresistive effect element which is high in thermal disturbance resistance $\Delta$ and low in write current Ic.

Now, various characteristic features of the magnetoresistive effect element in the present embodiment will be explained below.

Figure 4:
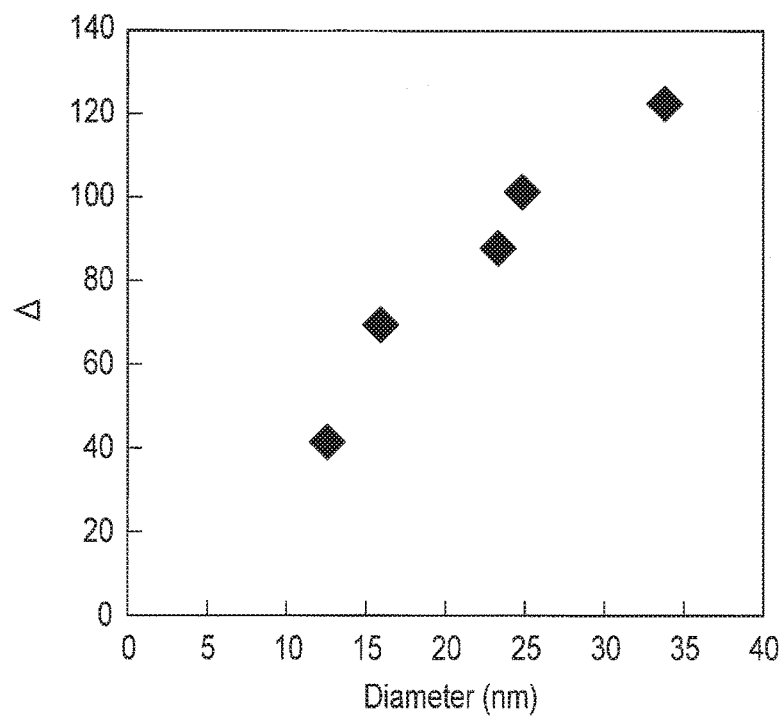
FIG. 4 is a view illustrating a change in measurement result of the thermal disturbance resistance Δ as the diameter of a pattern of the magnetoresistive effect element in the first embodiment is changed.

FIG. 4 is a view illustrating a change in measurement result of the thermal disturbance resistance $\Delta$ as the diameter of a pattern of the magnetoresistive effect element in the first embodiment is changed. As illustrated in FIG. 4, even if the size (diameter) of the pattern of a magnetoresistive effect element is changed, it is possible to obtain a high thermal disturbance resistance $\Delta$. In particular, a high thermal disturbance resistance $\Delta$ is obtained when the diameter is not less than 15 nm.

Figure 5:
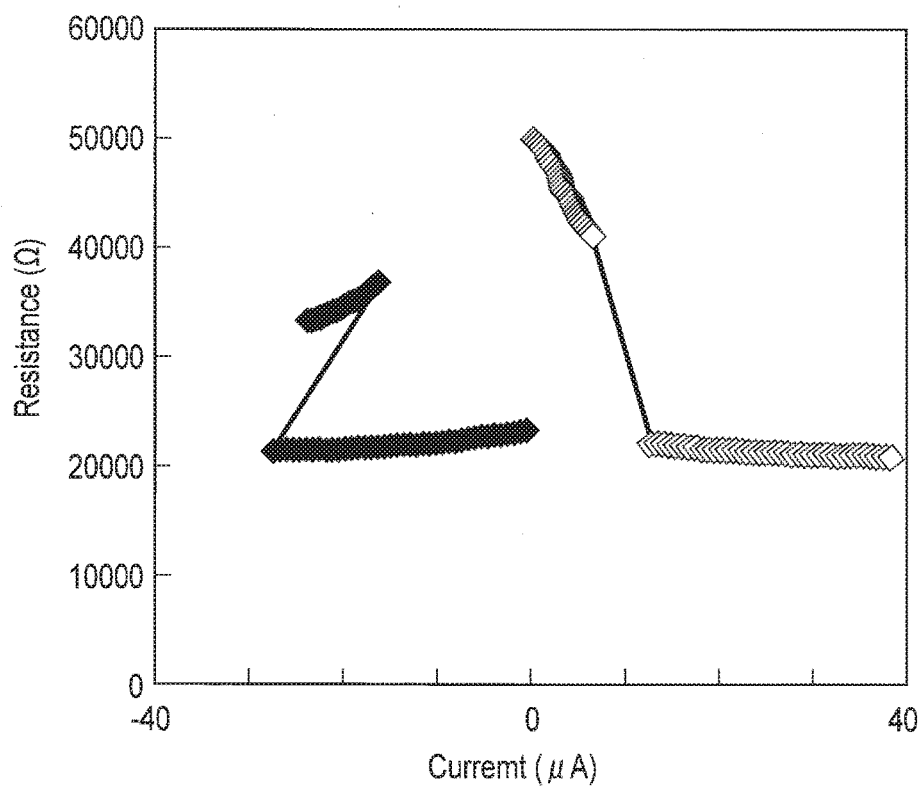
FIG. 5 is a view illustrating the relation between current and resistance obtained by measuring the magnetoresistive effect element in the first embodiment.

FIG. 5 is a view illustrating the relation between current and resistance obtained by measuring the magnetoresistive effect element in the present embodiment. FIG. 6 is a view illustrating the relation between a magnetic field and resistance obtained by measuring the same magnetoresistive effect element as the magnetoresistive effect element used for measurement of FIG. 5. As apparent from FIG. 5 and FIG. 6, it is possible to achieve magnetization reversal with low current and to obtain a high coercive force Hc.

As apparent from the result of FIG. 4, FIG. 5, and FIG. 6, the magnetoresistive effect element in the present embodiment achieves a high thermal disturbance resistance $\Delta$ and a low write current Ic.

FIG. 7 is a view illustrating the relation between thickness and Ic/$\Delta$ obtained based on the measurement results of the second layer (CoFeB layer) 12. A value required for achieving a change from a low- to a high-resistance state in 30 ns as a write operation is used for expressing Ic. FIG. 7(a) illustrates a case where the thickness of the first layer (CoFeB layer) 11 is 1.4 nm, and the thickness of the third layer (MgFeO layer) 13 is 0.9 nm. FIG. 7(b) illustrates a case where the thickness of the first layer (CoFeB layer) 11 is 1.2 nm, and the thickness of the third layer (MgFeO layer) 13 is 0.8 nm. The size (diameter) of the pattern of a magnetoresistive effect element is 27 nm.

The value of Ic/$\Delta$ becomes smaller as the second layer 12 becomes thicker, as illustrated in FIG. 7. Consequently, a high thermal disturbance resistance $\Delta$ and a low write current Ic are achieved by making the second layer 12 thicker. Specifically, it is preferable that the thickness of the second layer 12 is 1.8 nm or more. In contrast, if the first layer 11 is thick, Ic/Δ does not change in the case of achieving a change from a low- to a high-resistance state as a write operation, but Ic/Δ decreases in the case of achieving a change from a high- to a low-resistance state as a write operation. Therefore, it is better to make the first layer 11 as thin as possible. However, if the first layer 11 is too thin, the MR ratio and Δ decrease, which is problematic. Consequently, it is preferable that the thickness of the first layer 11 is 1.6 nm or less in order to make Ic/Δ for changing a high-resistance state to a low-resistance state as a write operation smaller than Ic/Δ for changing a low-resistance state to a high-resistance state as a write operation. Moreover, it is preferable that the thickness of the first layer 11 is not less than 1.2 nm in order to prevent decreases in the MR ratio and A from easily occurring.

FIG. 8 is a view illustrating the magnitude of a ferromagnetic exchange coupling which the third layer (MgFeO layer) 13 between the first layer (CoFeB layer) 11 and the second layer (CoFeB layer) 12 exhibits at the room temperature. As illustrated in FIG. 8, when the thickness of the third layer (MgFeO layer) 13 is 0.9 nm, the magnitude of the exchange coupling (Jex) is greatest. When the thickness of the MgFeO layer becomes less than 0.8 nm, Jex decreases. As a result, He and the thermal disturbance resistance Δ decrease. Also, when the thickness of the MgFeO layer becomes greater than 1.0 nm, Jex decreases. As a result, He and the thermal disturbance resistance Δ decrease. Therefore, it is preferable that the thickness of the third layer (MgFeO layer) 13 is in the range of 0.8 to 1.0 nm. However, if the third layer (MgFeO layer) 13 is thin, the current required to change the magnetoresistive effect element from a low- to a high-resistance state as a write operation decreases. These facts make it possible to design the thickness of a layer to obtain a required thermal disturbance resistance Δ. Therefore, if the thermal disturbance resistance Δ is required to be about 60 to 80, the thickness of the third layer (MgFeO layer) 13 must be in the range of 0.7 to 0.9 nm.

From the above, it is preferable that the thickness of the second layer 12 is 1.8 nm or more, the thickness of the first layer 11 is between 1.2 and 1.6 nm, and the thickness of the third layer 13 is between 0.7 and 1.0 nm.

Moreover, it is desirable to make the boron (B) concentration of the second layer (CoFeB layer) 12 in the present embodiment less than 23 atom %. When the B concentration is greater than 23 atom %, the interface anisotropy produced between MgO and Fe within the third layer (MgFeO layer) 13 decreases, because of which the thermal disturbance resistance Δ decreases. Consequently, it is desirable to make the B concentration less than 23 atom %.

Moreover, it is desirable to set the boron (B) concentration of the first layer (CoFeB layer) 11 in the range of 17 to 27 atom %. If the B concentration becomes greater than 27 atom %, a problem of backhopping and erroneous writing occurs. If the B concentration becomes less than 17 atom %, the amorphous nature of a CoFeB layer decreases, resulting in a decrease in flatness. As a result, the MR ratio decreases and thus the reliability of the tunnel barrier layer suffers.

From the above, it is desirable to make the boron (B) concentration of the second layer (CoFeB layer) 12 less than 23 atom %, and to set the boron (B) concentration of the first layer (CoFeB layer) 11 in the range of 17 to 27 atom %. Moreover, the MR ratio can be increased by making the boron (B) concentration of the second layer (CoFeB layer) 12 less than the boron (B) concentration of the first layer (CoFeB layer) 11.

Figure 9:
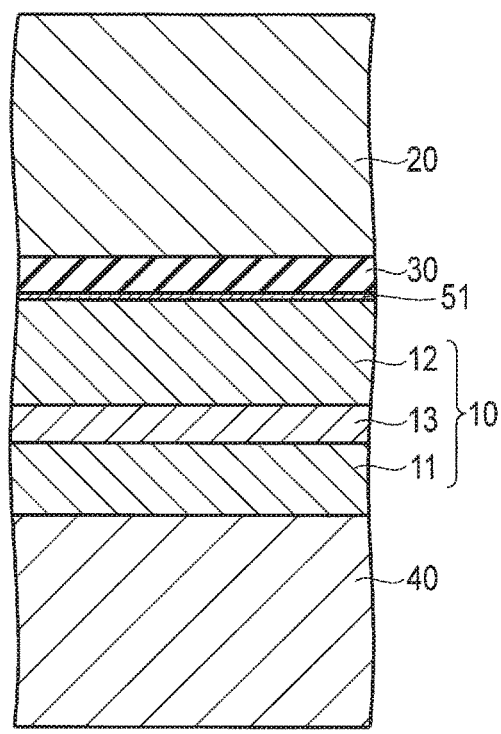
FIG. 9 is a sectional view schematically illustrating the configuration of a first modified example of the stack structure of the magnetoresistive effect element in the first embodiment.

FIG. 9 is a sectional view schematically illustrating the configuration of the first modified example of the stack structure of the magnetoresistive effect element in the present embodiment. In the first modified example, a magnesium layer (Mg layer) 51 is provided between a second layer (CoFeB layer) 12 and a tunnel barrier layer (MgO layer) 30.

Figure 10:
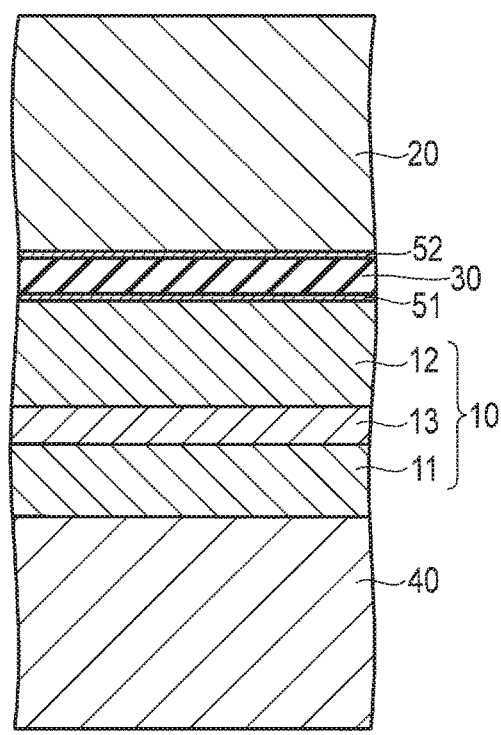
FIG. 10 is a sectional view schematically illustrating the configuration of a second modified example of the stack structure of the magnetoresistive effect element in the first embodiment.

FIG. 10 is a sectional view schematically illustrating the configuration of the second modified example of the stack structure of the magnetoresistive effect element in the present embodiment. In the second modified example, a magnesium layer (Mg layer) 51 is provided between a second layer (CoFeB layer) 12 and a tunnel barrier layer (MgO layer) 30, and a magnesium layer (Mg layer) 52 is provided between an undermost layer (CoFeB layer) of the reference layer 20 and a tunnel barrier layer (MgO layer) 30.

FIG. 11 is a view illustrating the change in the measured MR ratio as the stack structure is changed. FIG. 12 is a view illustrating a change in measurement result of a resistance-area product RA as the stack structure is changed in configuration. The point indicated by (a) within FIG. 11 and the point indicated by (a) within FIG. 12 individually are a measurement result of a case where neither the Mg layer 51 nor the Mg layer 52 are provided. The point illustrated by (b) within FIG. 11 and the point illustrated by (b) within FIG. 12 individually are a measurement result of a case where the Mg layer 51 alone is provided (a case of the first modified example). The point illustrated by (c) within FIG. 11 and the point illustrated by (c) within FIG. 12 individually are a measurement result of a case where the Mg layer 51 and the Mg layer 52 are provided (a case of the second modified example). It should be noted that, in any case, the thickness of the tunnel barrier layer (MgO layer) is 1.0 nm. Moreover, each thickness of the Mg layer 51 and the Mg layer 52 is 0.2 nm.

As illustrated in FIG. 11, using the configuration of the first modified example increases the MR ratio, and using the configuration of the second modified example further increases the MR ratio. Consequently, the use of the configuration of the first or second modified examples makes it possible to obtain a magnetoresistive effect element which has more desirable characteristics.

Moreover, a stack film comprising an Mg layer (0.2 nm), an Si layer (0.2 nm) and an Mg layer (0.2 nm) may be provided between the reference layer 20 and the tunnel barrier layer 30. It should be noted that the undermost layer (interface layer) of the reference layer 20 may be formed of a CoFeB layer containing silicon (Si). And, it is possible to cancel the shifted magnetic field of the storage layer 10 only by adjusting the Tb concentration in the reference layer 20 so that the TbCoFe layer and the CoFeB layer containing Si may be antiparallel with each other in magnetization direction. As a result, it is not necessary to provide a shift canceling layer for canceling a shifted magnetic field, reducing the manufacturing cost.

Moreover, the third layer (MgFeO layer) 13 of the storage layer 10 may include an oxygen deficiency structure. When the MgFeO layer which has an oxygen deficiency structure is used as the third layer 13 in this way, reduction in resistance of the MgFeO layer and improvement in flatness of the storage layer 10 is achieved, and a magnetoresistive effect element which has a higher MR ratio is obtained.

Moreover, the third layer 13 of the storage layer 10 may contain aluminum (Al) in addition to magnesium (Mg), iron (Fe), and oxygen (O). That is, an MgAlFeO layer may be used for forming the third layer 13. Alternatively, a stack film comprising a layer containing magnesium (Mg), iron (Fe) and oxygen (O), and a layer containing aluminum (Al)

and nitrogen (N) may be used for the third layer 13. Specifically, an AlN layer may be provided between the second layer (CoFeB layer) 12 and the MgFeO layer. The layer containing aluminum tends to constitute amorphous structure. Therefore, the use of the above-mentioned structure makes it possible to improve flatness and to further increase the MR ratio.

It should be noted that the tunnel barrier layer (nonmagnetic layer) 30 may contain silicon (Si) in addition to magnesium (Mg) and oxygen (O). Moreover, an MgO layer which has an oxygen deficiency structure, or an MgSiO layer which has an oxygen deficiency structure may be used for the tunnel barrier layer 30. The use of such a tunnel barrier layer 30 makes it possible to obtain a thick tunnel barrier layer, so that the MR ratio of the magnetoresistive effect element and the reliability for the dielectric breakdown can be further improved.

Figure 13:
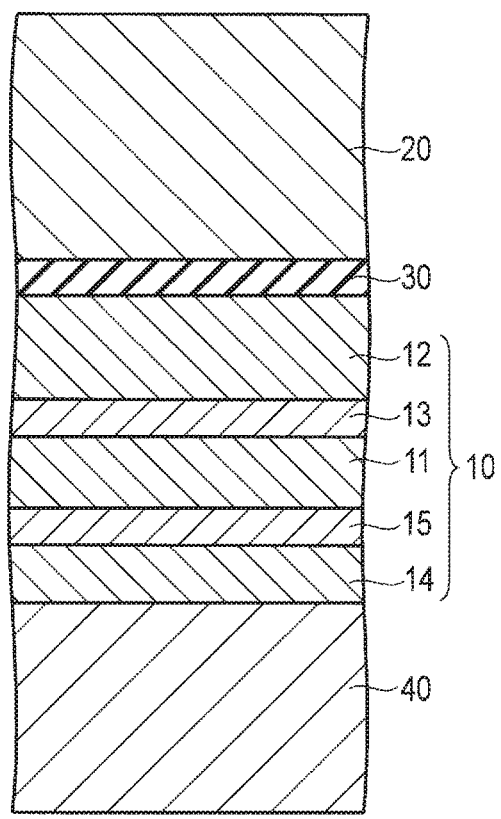
FIG. 13 is a sectional view schematically illustrating the configuration of a third modified example of the stack structure of the magnetoresistive effect element in the first embodiment.

It should be noted that the storage layer 10 in the above-mentioned embodiment comprises the first layer 11, the second layer 12, and the third layer 13. However, as illustrated in FIG. 13, the number of layers included in the storage layer 10 may be increased. FIG. 13 is a sectional view schematically illustrating the configuration of a third modified example of the stack structure of the magnetoresistive effect element in the present embodiment.

In the present modified example, a storage layer (a first magnetic layer) 10 further includes a fourth layer 14 and a fifth layer 15 between a first layer 11 and a fourth layer 14. The fourth layer 14 contains iron (Fe) and boron (B). The fourth layer 14 in the present embodiment furthermore contains cobalt (Co) in addition to iron (Fe) and boron (B). Specifically, the fourth layer 14 is a CoFeB layer. The fifth layer 15 contains magnesium (Mg), iron (Fe), and oxygen (O). Specifically, the fifth layer 15 is an MgFeO layer. A thickness of the fourth layer 14 is smaller than that of the first layer 11.

The same effect as the above-mentioned embodiment, i.e., a low Ic, is obtained by making the magnetic layers (first layer 11, second layer 12, and fourth layer 14, in the example of FIG. 13), each being a constituent of the storage layer 10 and containing iron (Fe) and boron (B), gradually thinner as being away from the tunnel barrier layer 30. An increase in the number of layers of the storage layer 10 increases the activation volume and attainment of high Δ.

Assuming that n denotes the number of magnetic layers each containing iron (Fe) and boron (B), the number of magnetic layers each containing magnesium (Mg), iron (Fe), and oxygen (O) is denoted by n−1. The same effect as the above-mentioned embodiment is obtained by making the magnetic layers, each containing iron (Fe) and boron (B), gradually thinner as being away from the tunnel barrier layer 30.

Embodiment 2

Now, a second embodiment will be explained. It should be noted that, since fundamental matters are the same as those of the first embodiment, explanation of the matters having been already explained in the first embodiment will be omitted.

In the present embodiment, the first layer contains a predetermined element selected from tantalum (Ta), tungsten (W), hafnium (Hf), vanadium (V) and chromium (Cr).

Figure 14:
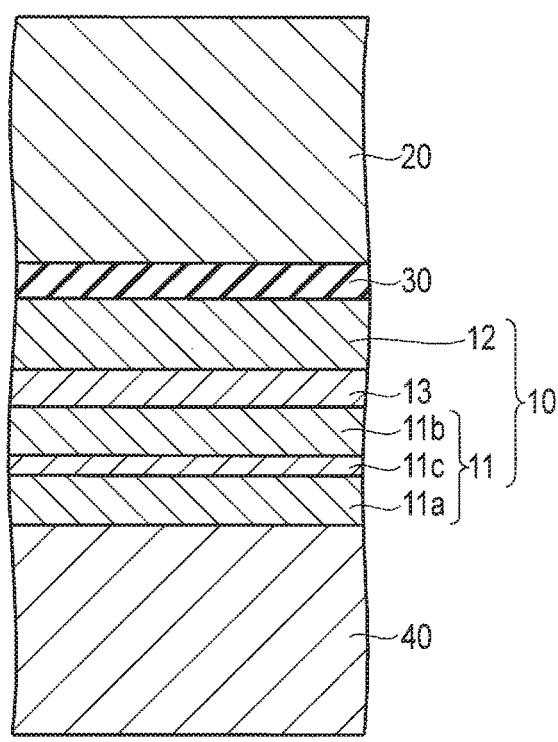
FIG. 14 is a sectional view schematically illustrating the configuration of the stack structure of the magnetoresistive effect element in a second embodiment.

FIG. 14 is a sectional view schematically illustrating the configuration of the stack structure of the magnetoresistive effect element in the present embodiment.

In the present embodiment, a first layer 11 of a storage layer 10 includes a lower layer portion 11a, an upper layer portion 11b, and an intermediate layer portion 11c between the lower layer portion 11a and the upper layer portion 11b. The intermediate layer portion 11c contains the above-mentioned elements. For example, the intermediate layer portion 11c is a Ta layer, a W layer, or a Hf layer. The lower layer portion 11a and the upper layer portion 11b individually contain iron (Fe) and boron (B). It is preferable that the thickness of the intermediate layer portion 11c is 0.2 nm or less. Other fundamental configurations are the same as those of the first embodiment.

Since the first layer 11 in the present embodiment has a three-layer structure, which comprises the lower layer portion 11a, the upper layer portion 11b, and the intermediate layer portion 11c, the first layer 11 may be thicker than the second layer 12. That is, the relation between the thickness of the first layer 11 and the thickness of the second layer 12 does not need to satisfy the thickness relation of the first embodiment.

In the example illustrated in FIG. 14, the lower layer portion 11a comprises a CoFeB layer and has a thickness of 1.4 nm, the upper layer portion 11b comprises a CoFeB layer and has a thickness of 1.4 nm, and the intermediate layer portion 11c is made of Ta and has a thickness of 0.1 nm. Furthermore, the second layer 12 comprises a CoFeB layer and has a thickness of 1.6 nm, and the third layer 13 comprises an MgFeO layer and has a thickness of 0.9 nm.

As mentioned above, the first layer 11 of the storage layer 10 in the present embodiment comprises the lower layer portion 11a, the upper layer portion 11b and the intermediate layer portion 11c containing the above-mentioned predetermined elements. By using such a configuration, the amount (Mst) of magnetization per unit area of the first layer 11 can be made small. As a result, the write current, especially the write current for changing the magnetoresistive effect element from a high- to a low-resistance state, is reduced. Specifically, it is possible to effectively reduce the write current only by making the thickness of the intermediate layer portion 11c 0.2 nm or less.

As has been described above, the present embodiment also makes it possible to make the amount (Mst) of magnetization per unit area of the first layer 11 smaller than the amount (Mst) of magnetization per unit area of the second layer 12, and thus a magnetoresistive effect element which is high in thermal disturbance resistance Δ and low in write current Ic is obtained without fail.

Figure 15:
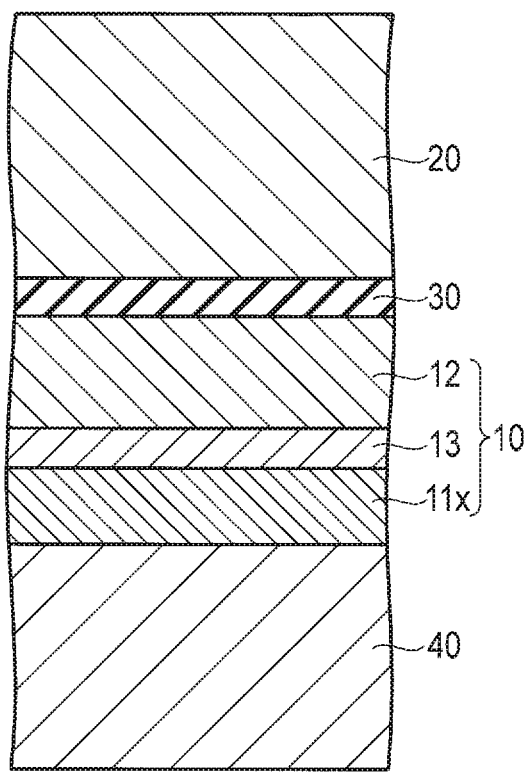
FIG. 15 is a sectional view schematically illustrating the configuration of the modified example of the stack structure of the magnetoresistive effect element in the second embodiment.

FIG. 15 is a sectional view schematically illustrating the configuration of a modified example of the stack structure of the magnetoresistive effect element in the present embodiment.

In the present modified example, the first layer 11x contains the predetermined elements mentioned above. For example, the first layer 11x has a configuration in which a CoFeB layer contains vanadium (V), chromium (Cr), tantalum (Ta), tungsten (W), or hafnium (Hf). It is preferable that the content of an element (V or Cr) contained in the CoFeB layer is in the range of 10 to 30 atom %.

Even such a configuration makes it possible to make the amount (Mst) of magnetization per unit area of the first layer 11x smaller than the amount (Mst) of magnetization per unit area of the second layer 12, and thus a magnetoresistive effect element which is high in thermal disturbance resistance Δ and low in write current Ic is obtained.

In the above described embodiments, expressions such as CoFeB (cobalt iron boron), FeB (iron boron), MgO (magnesium oxide), MgFeO (magnesium iron oxide), TbCoFe (terbium cobalt iron) do not always mean a composition ratio of each of these materials. For example, the expression of CoFeB means that CoFeB material contains Co, Fe and B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
a stack structure including a first magnetic layer variable in magnetization direction, a second magnetic layer fixed in magnetization direction, and a nonmagnetic layer between the first magnetic layer and the second magnetic layer, the first magnetic layer including a first layer, a second layer, and a third layer between the first layer and the second layer and containing magnesium (Mg), iron (Fe), and oxygen (O), the second layer being between the nonmagnetic layer and the third layer,
wherein a thickness of the second layer is greater than that of the first layer, and the thickness of the first layer is greater than that of the third layer.

2. The device of claim 1, wherein the first layer contains iron (Fe) and boron (B).

3. The device of claim 1, wherein the second layer contains iron (Fe) and boron (B).

4. The device of claim 1, wherein the third layer includes an oxygen deficiency structure.

5. The device of claim 1, wherein the nonmagnetic layer contains magnesium (Mg), silicon (Si), and oxygen (O).

6. The device of claim 1, wherein the first magnetic layer further includes a fourth layer containing iron (Fe) and boron (B), and a fifth layer between the first layer and the fourth layer, between the third layer and the fourth layer, and containing magnesium (Mg), iron (Fe) and oxygen (O), and a thickness of the fourth layer is smaller than that of the first layer.

7. The device of claim 1, wherein the first layer is smaller than the second layer in magnetization amount per unit area.

8. A magnetic memory device comprising:
a stack structure including a first magnetic layer variable in magnetization direction, a second magnetic layer fixed in magnetization direction, and a nonmagnetic layer between the first magnetic layer and the second magnetic layer, the first magnetic layer including a first layer, a second layer, and a third layer between the first layer and the second layer and containing magnesium (Mg), iron (Fe), and oxygen (O), the second layer being between the nonmagnetic layer and the third layer,
wherein the first layer contains a predetermined element selected from tantalum (Ta), tungsten (W), hafnium (Hf), vanadium (V) and chromium (Cr).

9. The device of claim 8, wherein the first layer further contains iron (Fe) and boron (B).

10. The device of claim 8, wherein the first layer includes a lower layer portion, an upper layer portion, and an intermediate layer portion between the lower layer portion and the upper layer portion and containing the predetermined element.

11. The device of claim 8, wherein the second layer contains iron (Fe) and boron (B).

12. The device of claim 8, wherein the third layer includes an oxygen deficiency structure.

13. The device of claim 8, wherein the nonmagnetic layer contains magnesium (Mg), silicon (Si), and oxygen (O).

14. The device of claim 8, wherein the first layer is smaller than the second layer in magnetization amount per unit area.

15. A magnetic memory device comprising:
a stack structure including a first magnetic layer variable in magnetization direction, a second magnetic layer fixed in magnetization direction, and a nonmagnetic layer between the first magnetic layer and the second magnetic layer, the first magnetic layer including a first layer, a second layer, and a third layer between the first layer and the second layer and containing magnesium (Mg), iron (Fe), and oxygen (O), the second layer being between the nonmagnetic layer and the third layer,
wherein the first layer is smaller than the second layer in magnetization amount per unit area.

16. The device of claim 15, wherein the first layer contains iron (Fe) and boron (B).

17. The device of claim 15, wherein the second layer contains iron (Fe) and boron (B).

18. The device of claim 15, wherein the third layer includes an oxygen deficiency structure.

19. The device of claim 15, wherein the nonmagnetic layer contains magnesium (Mg), silicon (Si), and oxygen (O).

* * * * *